United States Patent [19]
Sakamoto

[11] Patent Number: 5,283,205
[45] Date of Patent: Feb. 1, 1994

[54] METHOD FOR MANUFACTURING A SEMICONDUCTOR DEVICE ON A SUBSTRATE HAVING AN ANISOTROPIC EXPANSION/CONTRACTION CHARACTERISTIC

[75] Inventor: Naoya Sakamoto, Kanagawa, Japan

[73] Assignee: Semiconductor Energy Laboratory Co., Ltd., Kanagawa, Japan

[21] Appl. No.: 852,977

[22] Filed: Mar. 17, 1992

[30] Foreign Application Priority Data

Mar. 19, 1991 [JP] Japan ..................................... 3-80993

[51] Int. Cl.$^5$ ............................................. H01R 21/22
[52] U.S. Cl. ..................................... 437/147; 437/101;
437/924; 148/DIG. 102
[58] Field of Search ....................... 437/924, 147, 101;
148/DIG. 102, DIG. 106, DIG. 103, 984

[56] References Cited

U.S. PATENT DOCUMENTS

| | | | |
|---|---|---|---|
| 4,256,829 | 3/1981 | Daniel | 437/153 |
| 4,936,930 | 6/1990 | Gruber et al. | 437/924 |

FOREIGN PATENT DOCUMENTS

| | | | |
|---|---|---|---|
| 52-22479 | 8/1975 | Japan | 437/924 |
| 60-42828 | 7/1985 | Japan | 148/DIG. 102 |

*Primary Examiner*—Olik Chaudhuri
*Assistant Examiner*—H. Jey Tsai
*Attorney, Agent, or Firm*—Sixbey, Friedman, Leedom & Ferguson

[57] ABSTRACT

A method for manufacturing a semiconductor device which allows to form a semiconductor device on an insulating amorphous material or an insulating crystallized glass in high precision alignment is provided.

The present invention is characterized in that alignment markers of masks are formed along a direction in which a degree of expansion-contraction of a substrate is smaller when the semiconductor device is fabricated by laminating thin films having patterns on the substrate.

14 Claims, 7 Drawing Sheets

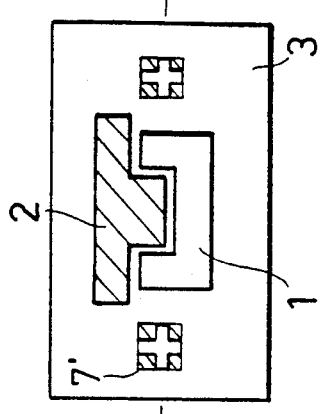
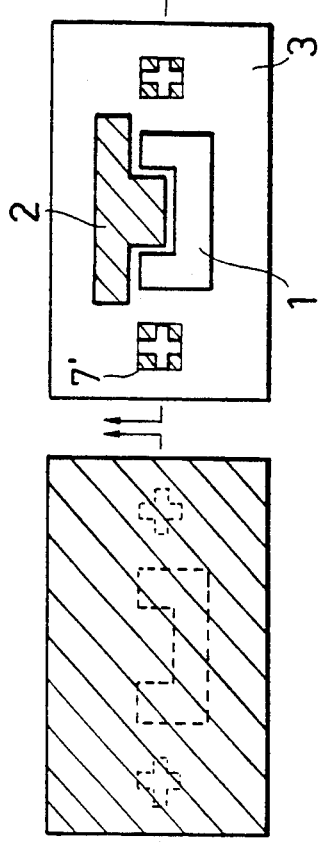
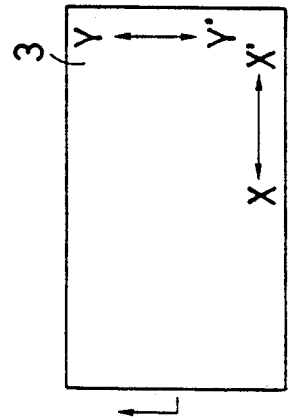
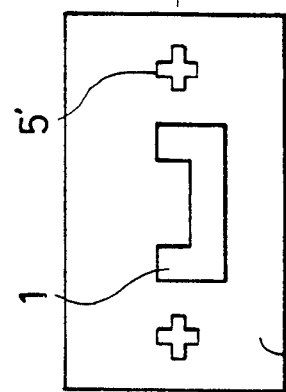
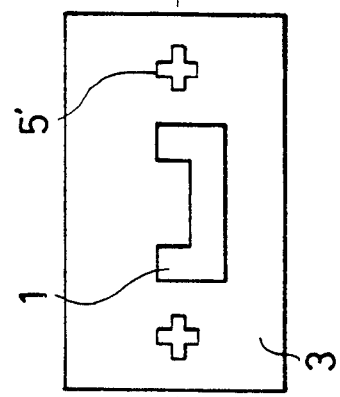
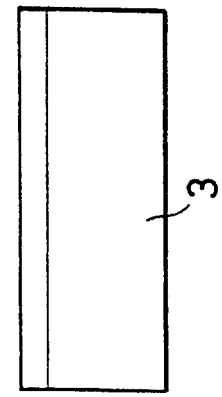
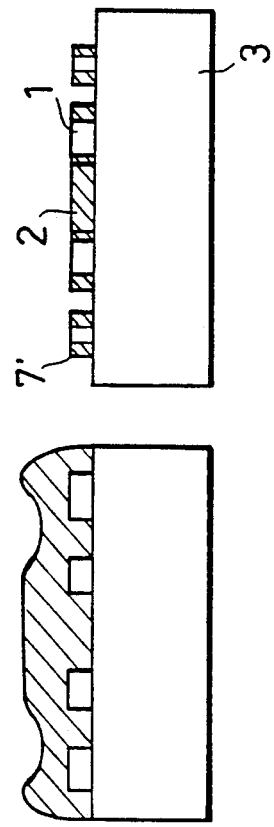
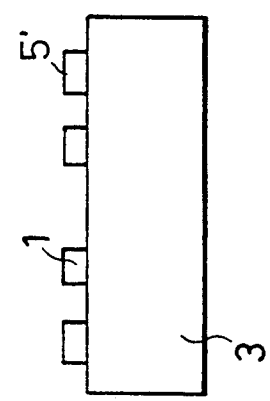

METHOD FOR MANUFACTURING A SEMICONDUCTOR DEVICE ON A SUBSTRATE HAVING AN ANISOTROPIC EXPANSION/CONTRACTION CHARACTERISTIC

BACKGROUND OF THE INVENTION

The present invention relates to a method for manufacturing a semiconductor device by laminating and forming thin films on an insulating amorphous material and on an insulating crystallized material.

When a semiconductor device is to be formed on a substrate, such insulating amorphous material as quartz and such insulating crystallized material as what glass is treated by heat to create a crystal nucleus and to grow crystal to deposit the crystal, for example, are used for the substrate.

Moreover, needs for such semiconductor devices as a large size liquid crystal panel or an image sensor utilized in equipments such as a facsimile scanner is increasing lately.

Due to that, it has become necessary to lower the cost of those semiconductor devices by manufacturing them by increasing their yield. In order to manufacture semiconductor devices by increasing their yield, a precision of technique for aligning a mask pattern of a coating film to be formed next to a pattern of a coating film already formed on a substrate has to be improved.

In a case of forming a thin film transistor, an insulating non-crystal material having an excellent heat resistance such as quartz is used as the substrate since such high temperature heat treatments as follows are carried out in the manufacturing process: 1) poly-crystallization of an amorphous layer mainly of silicon, 2) formation of a gate oxide film, and 3) implantation of ions. However, a manufacturing cost of such insulating amorphous materials having an excellent heat resistance as quartz is high, so that it is a factor that hampers the realization of low cost semiconductor devices especially when a semiconductor device is to be formed on a large size substrate. Then a method for fabricating a semiconductor device on a crystallized glass, which is cheaper than quartz, as an insulating substrate material used for forming semiconductor devices has been drawing an attention and its studies are being conducted.

However, crystallized glass has a property to expand and contract when treated by heat and its degree of expansion-contraction is asymmetrical to the forming direction when the substrate is manufactured (the substrate has an anisotropy in a degree of expansion-contraction), e.g. to the solidification direction for forming the substrate by melting once and solidifying it and to the crystallization direction into which crystal is deposited, so that when a mask pattern for a film which is to be formed next to a pattern of a film already formed on the substrate is superimposed, the patterns are dislocated and it has been difficult to fabricate a semiconductor device by laminating thin films having very fine patterns. Therefore, even if such semiconductor device may be fabricated, high precision alignment has been impossible in photolithographic process, thereby causing such problems that yield is lowered due to the dislocation of the alignment and that thereby the cost is increased.

Accordingly, it is an object of the present invention to solve the aforementioned problems by providing a method for manufacturing a semiconductor device which allows to form a semiconductor device in a high precision alignment on such substrate that has an anisotropy in a degree of expansion-contraction when treated by heat like an insulating amorphous material and an insulating crystallized glass.

SUMMARY OF THE INVENTION

According to the method for manufacturing a semiconductor device of the present invention, alignment markers which define a direction for forming the semiconductor device are disposed along a direction in which a degree of expansion-contraction of a crystallized material is smaller when a semiconductor device is formed on the substrate.

Materials of the substrate to which the present invention may be applied are insulating amorphous materials such as quartz and insulating crystallized materials such as what glass is treated by heat and crystal nucleus is created and crystal is grown to deposit the crystal.

According to the present invention, since the alignment markers for photolithography are disposed along the direction in which the degree of expansion-contraction of the substrate generated in a heat treatment process is smaller and thin films are laminated and patterned one by one based on the markers when a semiconductor is formed by the thin films, the dislocation of the patterns brought about when the patterns are aligned due to the expansion and contraction of the substrate may be suppressed to the minimum.

Furthermore, according to the present invention, photomasks need not be fabricated by gradually reducing distances between alignment markers taking the degree of expansion-contraction into account beforehand, so that designing of the masks is simplified. Other than that, a relationship of relative positions of the alignment markers mated can be confirmed by a readily available means such as a microscope, so that the alignment may be carried out in high precision having a reproducibility and thereby mass-production may be carried out (throughput is improved) because the work time is shortened and size of substrates may be increased.

BRIEF DESCRIPTION OF THE DRAWINGS

FIGS. 1A through 1D and 1A' through 1D' are drawings illustrating a process for fabricating patterns according to a first embodiment of the present invention;

DETAILED DESCRIPTION OF PREFERRED EMBODIMENTS

Figure 2A:
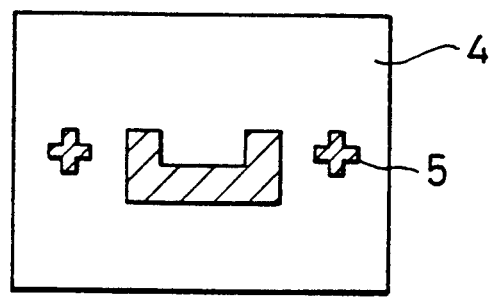
FIGS. 2A and 2B are drawings illustrating masks used in the first embodiment of the present invention.

Referring now to the drawings, preferred embodiments of the present invention will be explained.

First Embodiment

A method for laminating patterns 1 and 2 which are made from two kinds of materials on a substrate 3 as shown in FIG. 1D will be explained below. Here X-X' direction is assumed to be a direction in which coefficient of thermal contraction is smaller and Y-Y' direction is assumed to be a direction in which coefficient of thermal contraction is larger.

At first, a first layer is formed on the whole surface of the substrate 3 to form the pattern 1 as shown in FIGS. 1A and 1A'. The first layer is then patterned by a known photolithography using a mask 4 shown in FIG. 2A to obtain the pattern 1 as shown in FIGS. 1B and 1B'. Here FIG. 1B' is a sectional view of FIG. 1B in a horizontal direction. A mask pattern for forming the pattern 1 is provided on the mask 4. Mark patterns 5 are also provided on the mask 4, so that alignment marks 5' which are made from the same material with that of the first pattern is formed along the X-X' direction, i.e. the direction in which the coefficient of thermal contraction of the substrate is smaller, as shown in FIG. 1B.

Figure 2B:
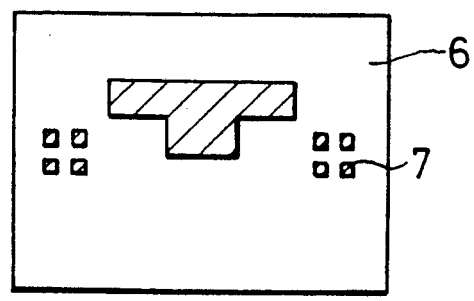
Figure 2C:
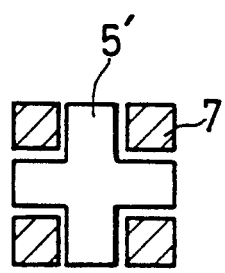
FIG. 2C is a drawing illustrating a state when the masks used in the first embodiment of the present invention is mated.

Next, a second layer is formed on the whole surface of the substrate 3 and the pattern 1 to form the pattern 2 as shown in FIGS. 1C and 1C'. It is then patterned using a mask 6 shown in FIG. 2B. Mark patterns 7 are provided on the mask 6 at predetermined locations and the mask 6 is positioned so that the mark patterns 7 and the marks 5' on the substrate mate respectively in a relationship as shown in FIG. 2C. The marks 5' may be observed by seeing directly through the second layer or by irregularities that appear on the second layer. Then the pattern 2 is formed by known photolithography and as a result, the patterns 1 and 2 as shown in FIGS. 1D and 1D' may be obtained (at this time, alignment marks 7' are also formed in the same time).

According to the present invention, even if thermal contraction is brought about in the substrate by conducting a heat treatment process between the formation processes of the first and second patterns, such damages as a dislocation of position of the second pattern may be suppressed to the minimum since the alignment markers are provided along the direction in which the coefficient of thermal contraction of the substrate is smaller. Accordingly, the heat treatment may be readily implemented on the first layer for such purpose of crystallizing it before forming the second layer. Although only the first and second patterns have been fabricated in this embodiment, third and fourth patterns may be laminated of course in accordance to the process described above.

Second Embodiment

A method for fabricating a thin film transistor shown in FIG. 4 will be described in this embodiment.

Figure 9:
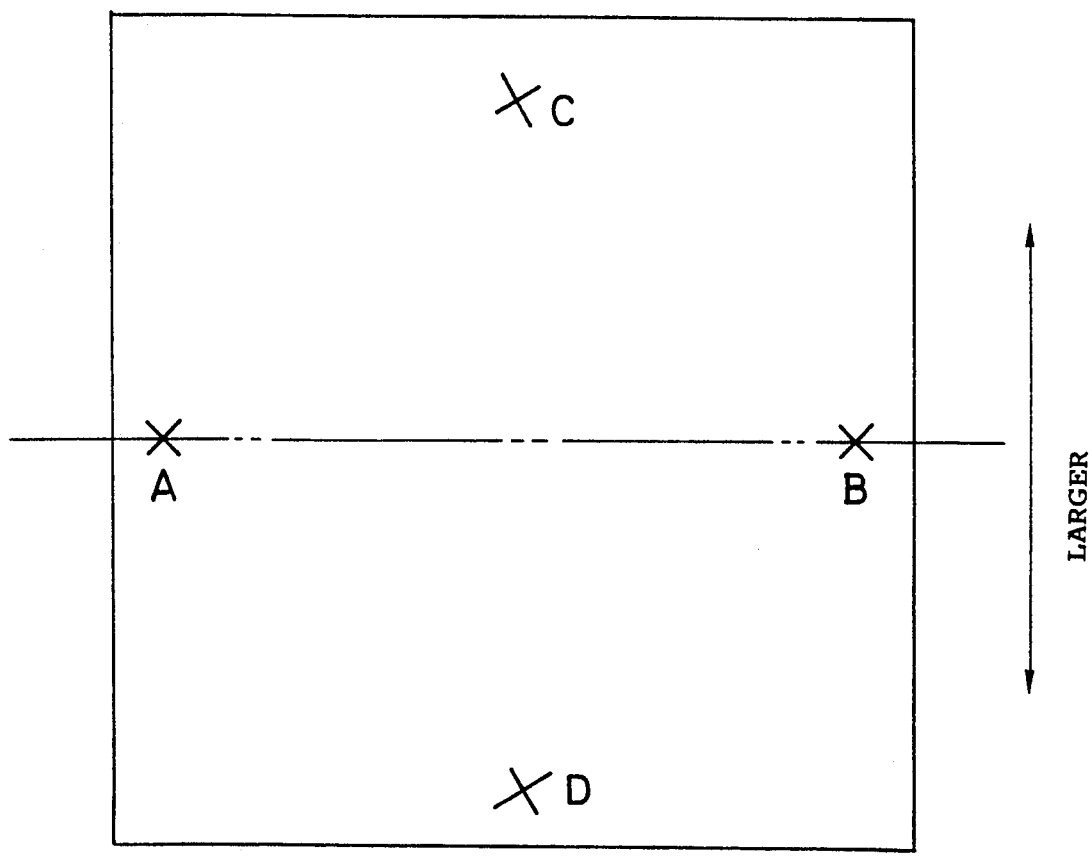
FIG. 9 is a diagram illustrating an arrangement of the alignment markers in the embodiment of the present invention.

At first, with reference to FIG. 9, in order to find out a degree of expansion-contraction of a substrate, alignment markers are formed by photolithography on a square glass substrate 13 (a glass substrate on which a crystallization process is implemented here) with 250 to 300 mm of vertical and horizontal sizes at two points of AB with a certain interval between 200 to 300 mm (200 mm here) according to size of the substrate and another two points of CD which are located at positions vertical to a line connecting AB.

Then the substrate on which such alignment markers are formed is put into a sintering furnace and left for 48 hours at 600° C.

When the substrate is taken out from the sintering furnace, a distance between AB and that between CD are measured by an optical microscope. Differences of the distance between AB and that between CD before and after the sintering are measured. As a result, the distance between AB contracted by 3 micrometer and the distance between CD contracted by 20 micrometer.

The degree of contraction to the distance between the alignment markers is generally 10 to 30 micrometer in the direction in which the contraction is larger and 2 to 5 micrometer in the direction in which the contraction is smaller to 200 mm of distance between alignment markers. In other words, the substrate has an anisotropy in the degree of expansion and contraction by 2-15 times.

Figure 3:
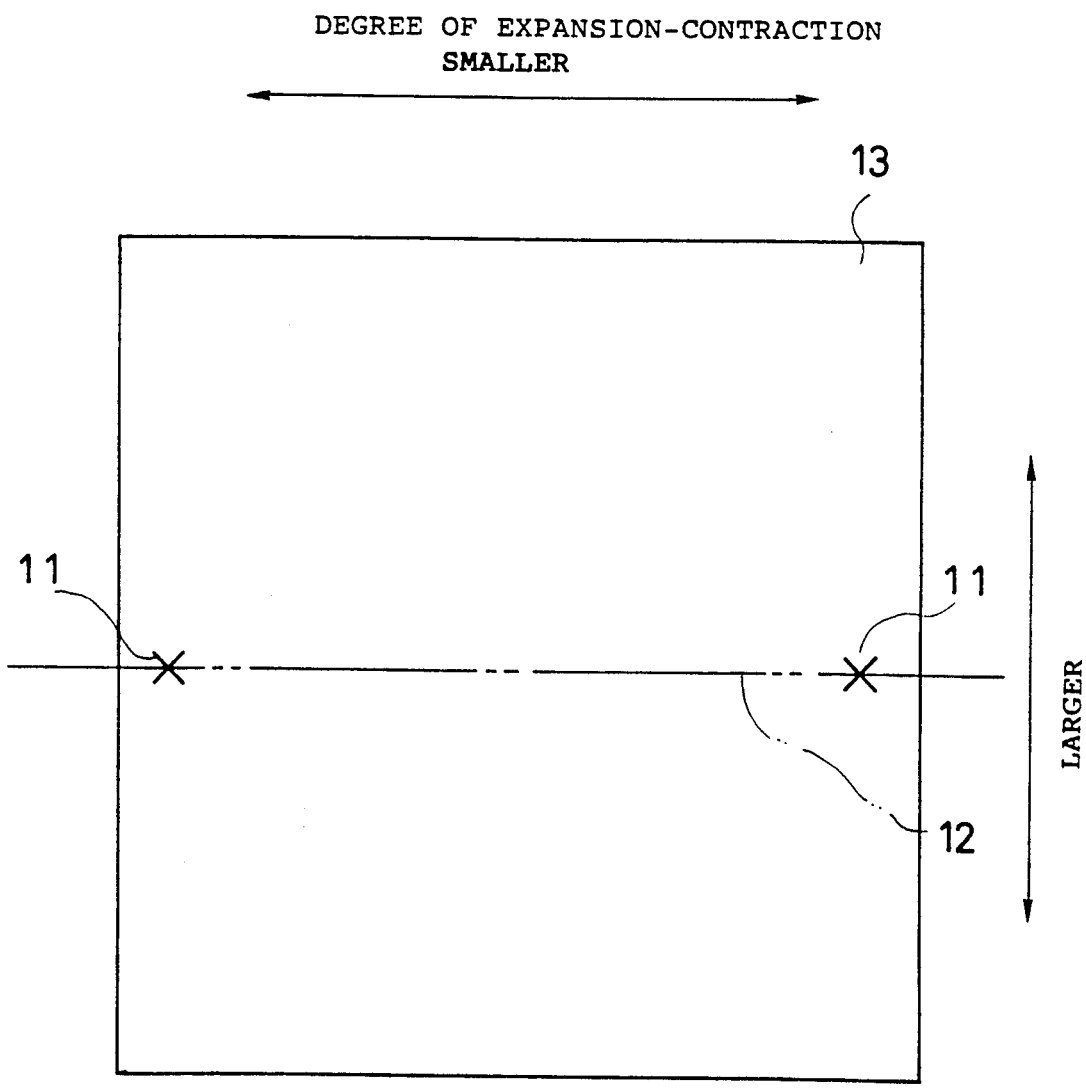
FIG. 3 is a diagram defining an arrangement of alignment markers in connection with degrees of expansion-contraction of a substrate.

After confirming such directionality of the degree of expansion-contraction of the substrate, the alignment markers 11 are disposed as shown in FIG. 3.

FIG. 3 shows a relationship of the directions of the degree of expansion-contraction of the substrate 13 and positions of the alignment markers. In FIG. 3, the glass substrate 13 is disposed so that the direction in which the degree of expansion-contraction of the substrate is smaller turns out to be the transverse direction and the direction in which the degree of expansion-contraction of the substrate is larger turns out to be the vertical direction when the substrate 13 is treated by heat.

Figure 4:
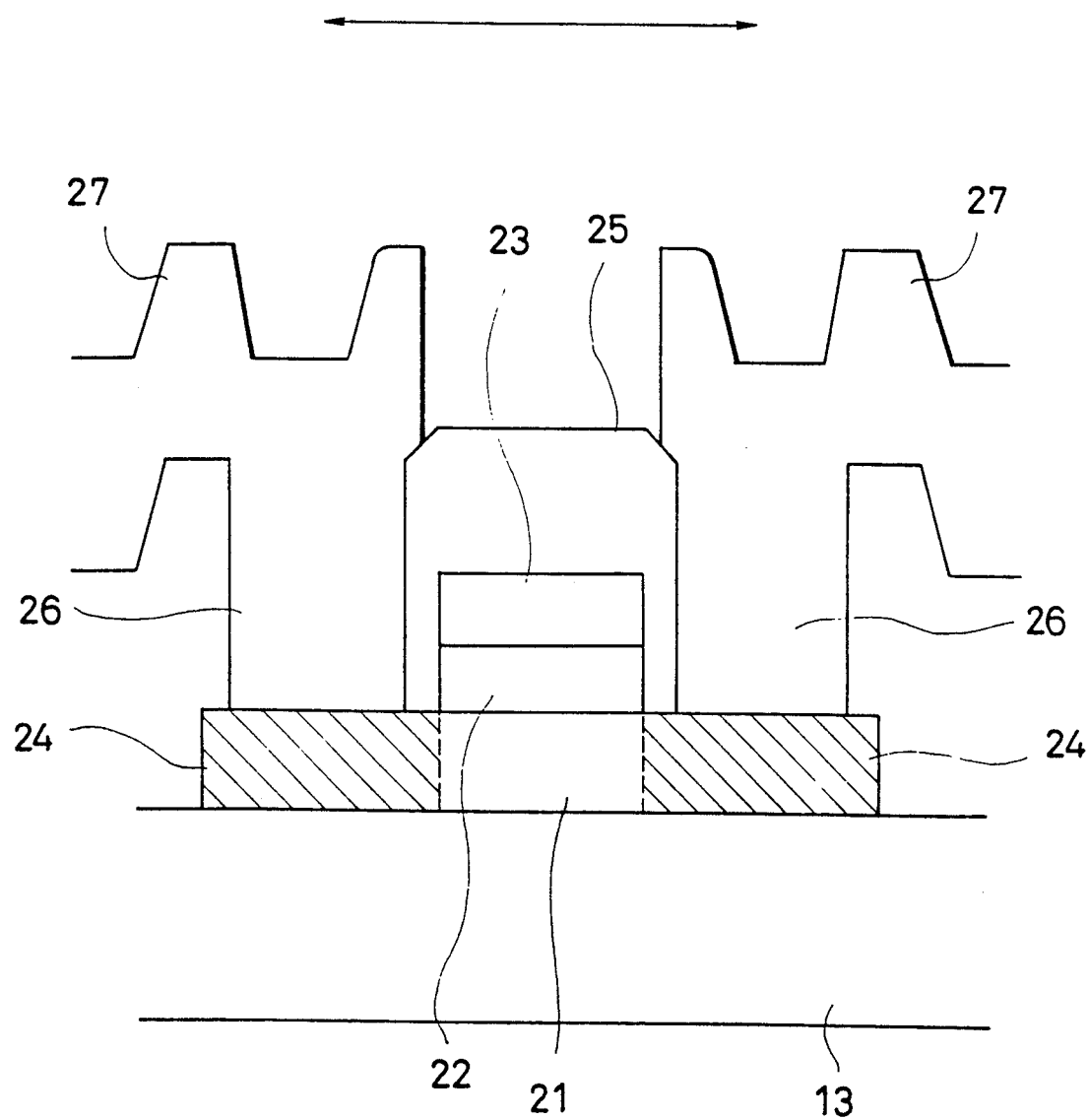
FIG. 4 is a section view of a thin film transistor according to a second embodiment of the present invention.

Then, as shown in FIG. 4, an amorphous silicon layer 21 mainly composed of silicon is coated with a thickness of 1500 Å by known CVD method on the glass substrate 13. After coating it, the whole glass substrate 13 is put into a sintering furnace and is heated for 48 hours at 600° C. By doing so, the amorphous silicon layer 21 is crystallized.

A mask is formed on the amorphous silicon layer 21 which has been treated with the crystallization step so that the layer is patterned into an island shape by using the mask. At this time, the mask is placed so that a pair of alignment markers which become the reference points are formed along the direction in which the degree of expansion-contraction of the substrate is smaller as shown in FIG. 3 in the same manner as set forth in the first embodiment.

Alignment markers are formed as shown in FIG. 3 in all steps in which patterning using photoresists is carried out.

Then, in order to form a gate insulating film 22 and a gate electrode 23, an insulating film and a conducting layer are sequentially formed with a thickness of 1000 Å and of 1500 Å, respectively. The gate insulating film 22 and the gate electrode 23 are formed by patterning them one by one from above.

Figure 5A:
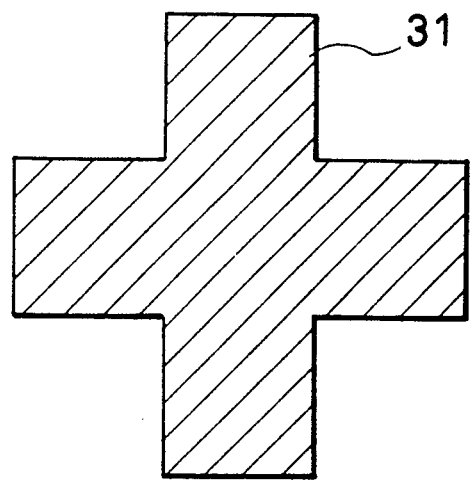
FIGS. 5a and 5b are drawings explaining concrete examples of the alignment markers.
Figure 5B:
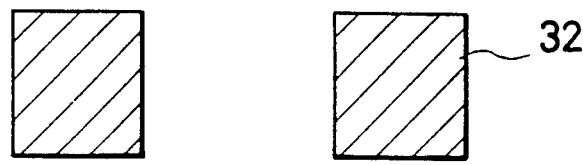

FIG. 5a shows the alignment marker of the amorphous silicon and FIG. 5b shows the alignment marker for forming the gate insulating film 22.

Figure 6:
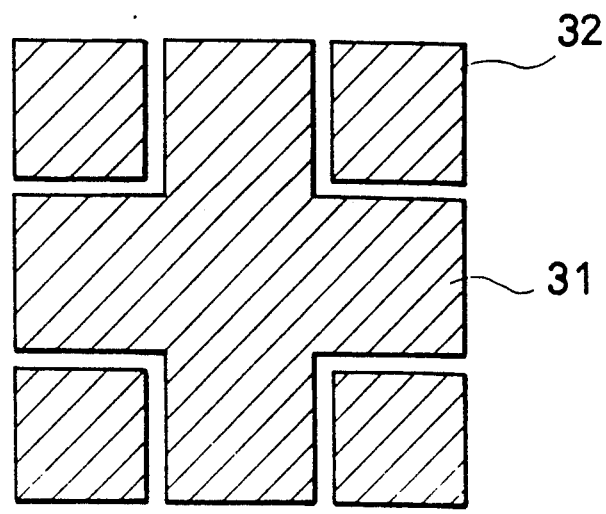
FIG. 6 is a drawing explaining a state when the alignment markers are mated.

The masks are mated by disposing those alignment markers as shown in FIG. 6.

The markers are mated not only for the amorphous silicon layer 21 and the gate insulating film 22, but also for aligning the gate electrode, an interlayer insulating film and contact holes in the same manner.

After forming the gate electrode 23, boron B or phosphorous P is ion-implanted to an area 24 in accordance to respective TFT types such as P channel and N channel. Here, for example, boron is ion-implanted to the area 24 to fabricate P channel and after the implantation, annealing is carried out in the sintering furnace for 24 hours at 600° C. to inactivate impurities implanted and to fabricate P-type conductive area 24.

After that, $SiO_2$ is formed into a film with a thickness of 12,000 Å as the interlayer insulating film 25.

Then using a photoresist, contact holes 26 are opened in the interlayer insulating film 25 and Al is coated with a thickness of 10,000 Å on the interlayer insulating film 25 by sputtering to form metallic wirings 27 and to complete the TFT by contacting source and drain areas.

A double layer film of Al-Cr may be used for the metallic wiring 27 other than the aforementioned Al wiring.

If the gate electrode is formed in a position dislocated from a predetermined position by the expansion and contraction of the substrate during the aforementioned series of fabricating processes, an insulating quality of the interlayer insulating film 25 lowers gradually along such phenomena as breakdown and desired characteristics of TFT may not be obtained. However, if TFT is fabricated according to the manufacturing method based on the present invention, a decrease of yield due to the dislocation of positions may be avoided even on a large size substrate.

Third Embodiment

Figure 7:
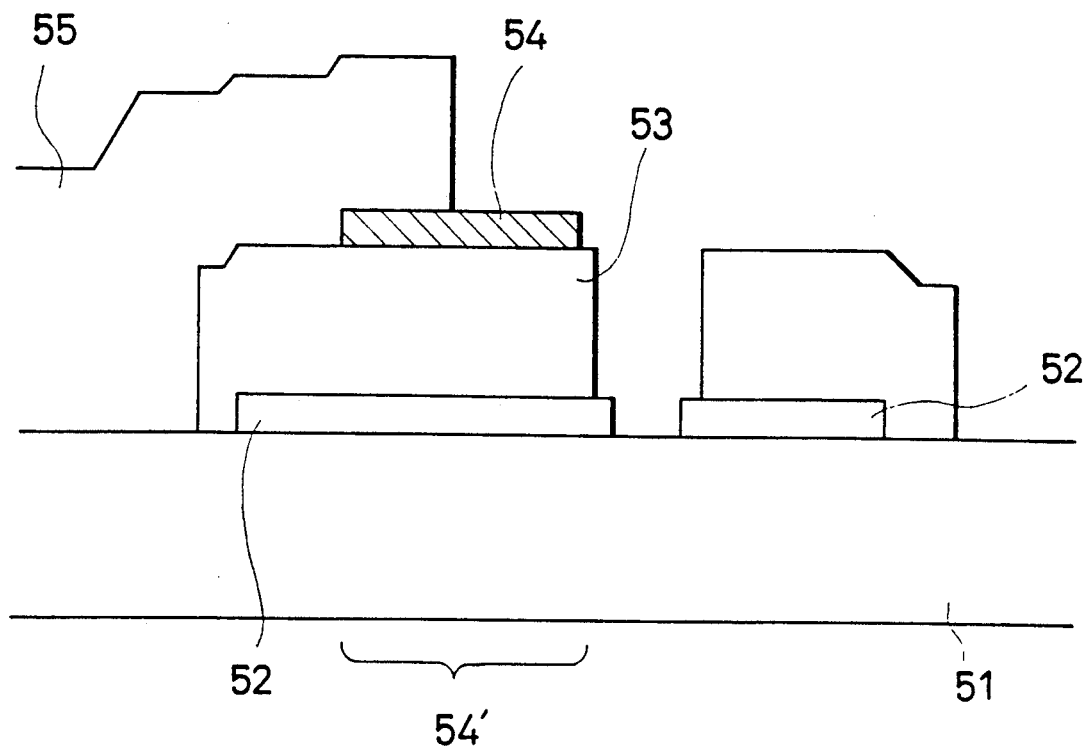
FIG. 7 is a section view of a full contact type image sensor in a third embodiment of the present invention.
Figure 8:
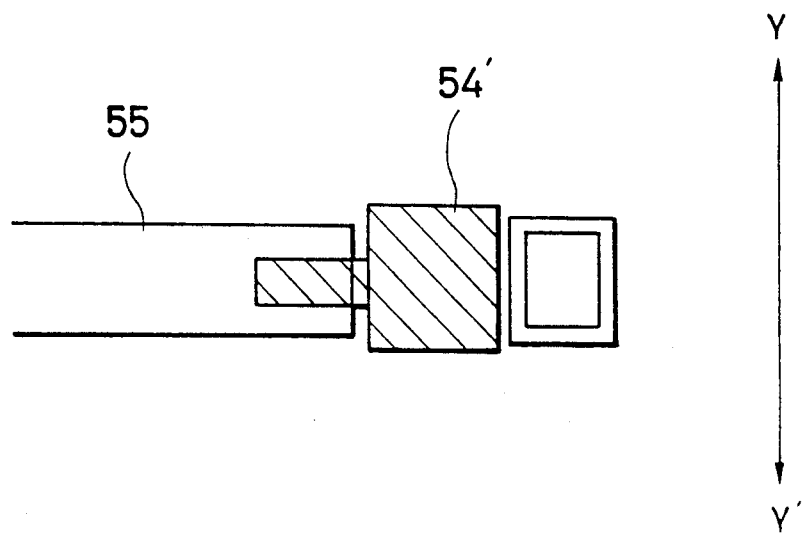
FIG. 8 is a plan view of the full contact type image sensor in the third embodiment of the present invention.

FIGS. 7 and 8 show a structure of a full contact type image sensor to which the present invention is applied.

A process for manufacturing the full contact type image sensor will be explained. At first, Cr film is formed with a thickness of 2000 Å by sputtering on a substrate 51 made from an insulating crystallized material and is etched into a predetermined shape by photolithography to fabricate a light blocking metallic electrode 52.

Then a photoelectric conversion layer 53 is formed with 7,000 Å of thickness by PCVD and a light transmitting conducting film 54 is formed with 1,000 Å of thickness by sputtering, successively. They are then patterned by photolithography to form an element section 54'. At this time, alignment markers are provided along a direction in which a degree of expansion-contraction of the substrate is smaller (Y-Y' direction in FIG. 8) and masks are positioned in accordance to the present invention.

FIG. 8 is a view of the full contact type image sensor in FIG. 7 seen from the above. Although only one sensor is shown in FIG. 8 for simplifying description thereof, actually a plurality of sensors are aligned on a line. At this time, the sensors are aligned so that the alignment direction, i.e. the longitudinal direction of the substrate, mate along the direction of the alignment markers, i.e. the Y-Y' direction.

Then the photoelectric conversion layer 53 is formed into a desired shape by dry-etching using a resist as a mask and a double layer of Cr and Al as wiring metal 55 is coated with 20,000 Å of thickness by sputtering. It is then patterned so that it contacts with the element. The full contact type image sensor is thus fabricated. Aluminum may be used for the wiring metal 55.

According to the present embodiment, the alignment markers are disposed in the direction in which the degree of expansion-contraction of the substrate is smaller, so that the light transmitting conducting film 54 and the wiring metal 55 may be assuredly contacted and a decrease of yield caused by a contact failure due to a disconnection caused by the dislocation of the alignment caused by the expansion and contraction of the substrate may be suppressed.

Although examples applied to the manufacturing processes of the thin film transistor and the full contact type image sensor have been shown in these embodiments, it is understood that the present invention is not limited to the above examples and that it may be utilized in all cases when thin films are laminated and formed by photolithography. Furthermore, not only insulating crystallized materials but also insulating amorphous materials, for example, may be used so long as it has an anisotropy in the degree of expansion-contraction as the material of the substrate and the same is true in using what an insulating film is coated on those substrates.

As described above, according to the present invention, when a semiconductor device is formed on a substrate which has an anisotropy in a degree of expansion-contraction, for example, on an insulating crystallized material in fabricating the semiconductor device by laminating thin films having patterns, alignment markers are formed in the direction in which the degree of expansion-contraction of the substrate is smaller, so that an alignment may be performed in high precision having a reproducibility. As a result, the decrease of yield caused by the dislocation of alignment can be suppressed and thereby the cost can be lowered.

Moreover, since the present invention may be applied to semiconductor devices in general in which thin films are laminated and formed, other than the thin film transistor and the full contact type image sensor shown in the embodiments, it becomes a very useful means for fabricating semiconductor devices.

What is claimed is:

1. A method for manufacturing a semiconductor device having at least one patterned thin film on a substrate comprising the steps of:

forming a film of material on said substrate, said substrate having an anisotropy in degree of expansion and contraction;

aligning a mask having a mask pattern with said substrate by using alignment markers provided on said substrate; and patterning said film of material by photolithography in accordance with said mask pattern, wherein said alignment markers are arranged on said substrate in a first direction in which said degree of expansion and contraction of said substrate is smaller than the degree of expansion and contraction of the substrate in a second direction different from said first direction.

2. The method of claim 1 wherein said substrate comprises an insulating amorphous or crystalline material.

3. The method of claim 2 wherein said substrate is a crystalline glass substrate.

4. The method of claim 2 wherein said substrate is a quartz substrate.

5. The method of claim 1 wherein said semiconductor device is a thin film semiconductor device.

6. The method of claim 1 wherein said substrate has the anisotropy in expansion and contraction in vertical and horizontal directions by 2 to 15 times.

7. A method for manufacturing a semiconductor device comprising the steps of:

forming a first layer of material on a substrate having anisotropy in degree of expansion and contraction;

patterning said first layer onto a first patterned layer, wherein first alignment markers are formed on said substrate in a first direction in which said degree is smaller than the degree of expansion and contraction of the substrate in a second direction different from said first direction;

forming a second layer of material on said substrate with said first patterned layer of material formed thereon;

aligning a mask having a mask pattern and second alignment markers therein with said substrate with said second layer of material formed thereon by adjusting said second alignment markers to said first alignment markers; and patterning said second layer of material in accordance with said mask pattern.

8. The method of claim 7 wherein said substrate comprises an insulating amorphous or crystalline material.

9. The method of claim 8 wherein said substrate is a crystalline glass substrate.

10. The method of claim 8 wherein said substrate is a quartz substrate.

11. The method of claim 7 wherein said semiconductor device is a thin film semiconductor device.

12. The method of claim 7 further comprising the step of heating said substrate between the step of forming said first patterned film and the step of forming the second layer.

13. The method of claim 12 wherein said heating step is done at a temperature at which said substrate expands or contracts.

14. The method of claim 7 wherein said substrate has the anisotropy in expansion and contraction in vertical and horizontal directions by 2 to 15 times.

* * * * *